US011394428B2

(12) United States Patent
Keitel-Schulz et al.

(10) Patent No.: US 11,394,428 B2
(45) Date of Patent: Jul. 19, 2022

(54) POWER REGULATION FOR LIGHTING USING NFC

(71) Applicant: Infineon Technologies AG, Neubiberg (DE)

(72) Inventors: Doris Keitel-Schulz, Hoehenkirchen (DE); Renate Angelika Muehlbauer, Munich (DE); Matthias Schneider, Kirchheim (DE); Qi Zhu, Munich (DE); Dieter Zipprick, Huellhorst (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/830,751

(22) Filed: Mar. 26, 2020

(65) Prior Publication Data

US 2020/0313727 A1 Oct. 1, 2020

(30) Foreign Application Priority Data

Apr. 1, 2019 (EP) .................................. 19166553

(51) Int. Cl.
| | |
|---|---|
| *H04B 5/00* | (2006.01) |
| *G06K 19/07* | (2006.01) |
| *H02J 50/80* | (2016.01) |
| *H04W 52/02* | (2009.01) |
| *H05B 45/24* | (2020.01) |
| *H05B 45/30* | (2020.01) |

(52) U.S. Cl.
CPC ............ *H04B 5/0031* (2013.01); *H02J 50/80* (2016.02); *H04B 5/0037* (2013.01); *H04B 5/0075* (2013.01); *H04W 52/02* (2013.01); *H05B 45/24* (2020.01); *H05B 45/30* (2020.01)

(58) Field of Classification Search
None
See application file for complete search history.

(56) References Cited

U.S. PATENT DOCUMENTS

| | | | | |
|---|---|---|---|---|
| 8,560,007 | B2* | 10/2013 | Seon ..................... | H04B 5/0081 |
| | | | | 455/552.1 |
| 8,811,897 | B2* | 8/2014 | Matsumoto ........ | G06K 19/0712 |
| | | | | 455/41.1 |
| 9,446,471 | B2* | 9/2016 | Hillen .................. | B23K 9/0953 |
| 9,537,537 | B2* | 1/2017 | Breitfuss ............ | G06K 19/0712 |
| 9,601,943 | B2* | 3/2017 | Partovi ................... | H01F 5/003 |

(Continued)

FOREIGN PATENT DOCUMENTS

| | | |
|---|---|---|
| CN | 106298960 A | 9/2016 |
| CN | 107731441 A | 2/2018 |

(Continued)

OTHER PUBLICATIONS

EP Search Report, EP 19166553.8, dated Nov. 27, 2019, pp. 16.
European Search Report, EP 20 20 2076, dated Feb. 24, 2021, pp. 1-12.

*Primary Examiner* — Tuan A Tran
(74) *Attorney, Agent, or Firm* — Armis IP Law, LLC

(57) ABSTRACT

According to one embodiment a circuit comprises a supply pin operable to receive a supply voltage, a non-volatile memory for storing one or more parameters, and a Near Field Communication (NFC) transceiver that is operable to receive data representing the one or more parameters. The circuit is operable to deactivate the NFC transceiver in response to receiving the supply voltage at the supply pin.

29 Claims, 2 Drawing Sheets

(56) References Cited

U.S. PATENT DOCUMENTS

| | | | |
|---|---|---|---|
| 9,928,672 B2* | 3/2018 | Jablokov | G08C 17/02 |
| 10,324,920 B2* | 6/2019 | Malcolm | G16H 10/60 |
| 10,664,735 B2* | 5/2020 | Maillet | G06K 7/0008 |
| 10,749,572 B2* | 8/2020 | Maillet | H03K 7/08 |
| 10,826,566 B2* | 11/2020 | Maillet | H04B 5/0031 |
| 2004/0017276 A1 | 1/2004 | Chen et al. | |
| 2008/0303624 A1 | 12/2008 | Yamada et al. | |
| 2012/0274228 A1* | 11/2012 | Szczeszynski | H05B 45/38 315/224 |
| 2013/0009738 A1 | 1/2013 | Chen et al. | |
| 2013/0234658 A1 | 9/2013 | Endo et al. | |
| 2014/0120832 A1 | 1/2014 | Confer et al. | |
| 2015/0099464 A1* | 4/2015 | Kiat | H01H 71/00 455/41.1 |
| 2017/0178797 A1 | 6/2017 | Todorov | |
| 2019/0268040 A1* | 8/2019 | Maillet | H03K 7/08 |
| 2019/0272935 A1 | 9/2019 | Li | |

FOREIGN PATENT DOCUMENTS

| | | |
|---|---|---|
| DE | 102015105466 A1 | 10/2015 |
| JP | H07192925 A | 7/1995 |
| JP | 2012104555 A | 5/2012 |
| WO | 2015104936 A1 | 7/2015 |
| WO | WO 2016081244 A1 | 5/2016 |
| WO | WO 2018010687 A1 | 1/2018 |

* cited by examiner

POWER REGULATION FOR LIGHTING USING NFC

RELATED APPLICATION

This application claims priority to earlier filed European Patent Application Serial Number EP19166553.8 entitled "POWER REGULATION FOR LIGHTING USING NFC," filed on Apr. 1, 2019, the entire teachings of which are incorporated herein by this reference.

BACKGROUND

LEDs (Light Emitting Diodes) are usually operated using a controlled load current. The load current control is usually implemented using dedicated LED driver circuits which may be operable to regulate the load current passing through a LED module (usually a series circuit of a plurality of LEDs) to match a given set-point. The set-point may be configurable. For example, the set-point may be set in accordance with an analog input voltage, which represents the information about the desired set-point (and thus about the desired output power). In low-cost applications, the set-point may be set using a resistor supplied with a constant current so that the voltage that determines the set-point is substantially proportional to the resistance of the resistor. In some applications DIP switches are used to select resistors of a resistor network, thereby adjusting the effective resistance of the resistor network which determines the mentioned set-point.

In applications in which the input voltage (supply voltage) can vary within a comparably wide range (e.g. 25 to 40 volts), a power limitation may be included in the LED driver circuit to ensure that the electrical power provided to the LED device does not exceed a maximum value. Similarly, the electrical power provided to the LED device should not fall below a minimum value. These power limits may also be configurable in order to comply with the requirements of a specific application. In some applications simple but expensive discrete analog circuitry is used to implement the above-mentioned power limitation.

In more sophisticated (with regard to flexibility) applications, a microcontroller may be used in connection with a LED driver circuit, wherein the microcontroller may be programmed to sense voltage and load current (using an analog-to-digital converter) and to control the above-mentioned set-point in order to operate the LED device within specified limits. Such a solution provides some improved flexibility, but still has some deficits with regard to handling, since the application-dependent and customer-dependent configuration parameters (e.g. nominal current set-point, power limit, etc.) need to be written into a non-volatile memory of the microcontroller at the end of the manufacturing process.

BRIEF DESCRIPTION OF EMBODIMENTS

According to one embodiment a circuit comprises a supply pin operable to receive a supply voltage, a non-volatile memory for storing one or more parameters, and a Near Field Communication (NFC) transceiver that is operable to receive data representing the one or more parameters. The circuit is operable to deactivate the NFC transceiver in response to receiving the supply voltage at the supply pin.

Further, a method for operating a circuit, which comprises a supply pin, a non-volatile memory, and a NFC transceiver, is described herein. In accordance with one embodiment, the method comprises—in a second mode of operation, in which no supply voltage is received at the supply pin—receiving, by the NFC transceiver, data representing one or more parameters and storing the one or more parameters in the non-volatile memory, and—in a first mode of operation, in which the supply voltage is received at the supply pin—deactivating the NFC transceiver.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION OF EMBODIMENTS

Figure 1:
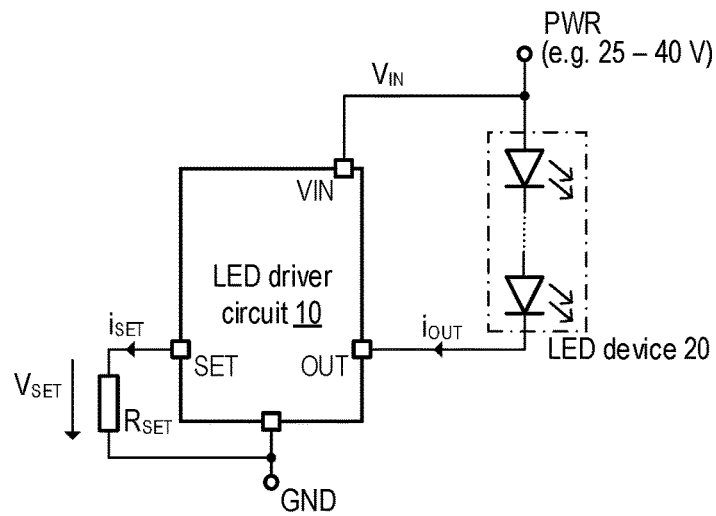
FIG. 1 illustrates a generic example of an LED device connected to a driver circuit.

FIG. 1 illustrates a generic example of a system including a LED device 20, which is usually composed of a series circuit of a plurality of LEDs (LED chain), and a LED driver circuit 10, to which the LED chain is connected. The LED driver circuit 20 may be implemented in one integrated circuit but may also be implemented using a combination of discrete circuit components and integrated circuits. Generally, the LED driver circuit 10 is operable to provide a load current $i_{OUT}$ to the LED device 20 and to control the load current $i_{OUT}$ so that its current value (at least approximately) matches a set-point (desired current value). It is understood that the system of FIG. 1 or similar systems may be used, for example, to produce a lighting module that includes the LED device 20 and all circuitry required to drive the LED device 20.

In the example of FIG. 1 the LED device 20 is connected between an output terminal OUT of the LED driver circuit 10 and a supply terminal PWR, to which an input voltage $V_{IN}$ is applied. The input voltage $V_{IN}$ may also be received at the terminal VIN of the LED driver circuit 10. Further, the LED driver circuit 10 is connected to a ground terminal GND. The input voltage $V_{IN}$ may vary within a comparably wide range. In the present example, the input voltage may vary between 25 and 40 volts. However, this range may be different in other applications. As the luminous flux generated by a LED basically depends on the load current passing through the LED, the load current needs to be regulated in accordance with a set-point as mentioned above. Further, the LED driver circuit 10 may be operable to operate the LED device 20 so that the electrical power (load current times input voltage) does not exceed a specific maximum power. In some applications the electrical power should not fall below a specific minimum power.

Particularly when using an integrated driver circuit, the customer/user needs to have the possibility to set the mentioned set-point that is used for load current regulation. In the example of FIG. 1 the set-point is determined by the voltage $V_{SET}$ received at analog input terminal SET. The voltage $V_{SET}$ may be applied either using an external voltage source or by connecting a resistor $R_{SET}$ between the analog input terminal SET and, e.g., ground terminal GND. In this case, the LED driver circuit may be operable to provide a defined constant current $i_{SET}$ at the terminal SET, thereby causing a voltage $V_{SET}=i_{SET} \cdot R_{SET}$ across the resistor $R_{SET}$ (wherein $R_{SET}$ also refers to the resistance of the respective resistor). The current set-point used for the regulation of the load current may be proportional to the voltage $V_{SET}$.

Using a discrete resistor $R_{SET}$ connected to an integrated LED driver circuit allows configuration of the mentioned set-point used for current regulation. However, such a solution increases the bill of material and, even more important, provides little flexibility as different LED devices 20 will usually require different resistors for selecting different set-points. If further parameters (in addition to the set-point) such as the above-mentioned maximum power are to be selected using external components, the complexity and related costs will increase even further.

Another known approach consists in the use of a programmable microcontroller for generating the voltage $V_{SET}$, which determines the set-point for load current regulation. A microcontroller may use analog-to-digital converters (included in common standard microcontrollers) to obtain measured values representing the input voltage $V_{IN}$ and the load current $i_{OUT}$, wherein a digital-to-analog converter may be used to generate the desired voltage $V_{SET}$, which may be adjusted, for example, dependent on an electrical power value calculated by the microcontroller based on the above-mentioned measured values. Although using microcontrollers may somewhat improve flexibility, there is still the need to set the load current set-point, e.g. by programming it into a non-volatile memory (NVM) of the microcontroller, e.g. using a wired in-system programming (ISP) interface at the end of production of each individual product. Furthermore, the approach of using a microcontroller entails significant costs for a microcontroller which will, in most cases, have a performance capability that is far too high for an application as simple as the present one.

Figure 2:
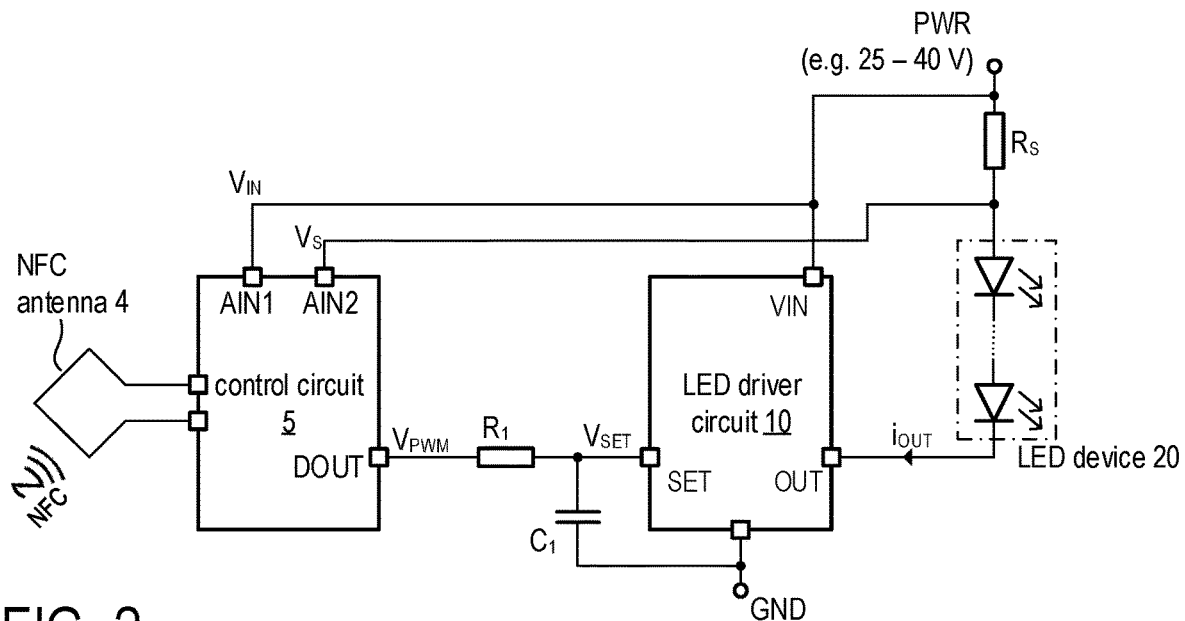
FIG. 2 illustrates one example of an application of an integrated control circuit with an integrated NFC module for the purpose of controlling an LED driver circuit connected to an LED device.

FIG. 2 illustrates a novel approach which may significantly improve flexibility while keeping the bill of materials and production costs low. The example of FIG. 2 includes a control circuit 5, an LED driver circuit 10 as well as an LED device 10 connected thereto. The LED driver circuit 10 and the LED device 20 are substantially the same as in the previous example of FIG. 1 and reference is made to the respective description above. Different from FIG. 1, a current sense resistor $R_S$ is coupled in series to the LED device 20 in order to allow measurement of the load current. In the present example, the resistor $R_S$ is connected between the LED device 20 and the terminal PWR, at which the input voltage $V_{IN}$ is provided. It is understood that other approaches for current sensing may be used instead. In other embodiments the shunt resistor or other current sense circuitry may be integrated in the LED device 20 and the current information can be tapped at a dedicated sense terminal of the LED device 20.

The control circuit 5 is operable to provide, at output terminal DOUT (digital output), an output voltage $V_{PWM}$ that is indicative of the set-point, which is used by the LED driver circuit for the purpose of output current regulation. In the present example, the output voltage $V_{PWM}$ is a pulse-width modulated (PWM) signal that is converted to an analog voltage $V_{SET}$ using, for example, a low pass. Dependent on the application, a simple R-C low-pass composed of one resistor $R_1$ and one capacitor $C_1$ may be sufficient to generate the voltage $V_{SET}$ from the PWM signal. The resistor $R_1$ and the capacitor $C_1$ may be integrated into the control circuit 5 or connected externally to an integrated circuit (IC). It is understood that pulse-width modulation is merely one example and other types of modulation, such as sigma-delta modulation, may be employed instead. In essence, the low-pass may be regarded as an digital-to-analog converter that is operable to convert the (binary) PWM signal into the analog voltage $V_{SET}$. It is understood that other approaches for digital-to-analog conversion may be used instead.

In the present example, the control circuit 5 has two analog inputs AIN1 and AIN2, which receive the input voltage $V_{IN}$ and the voltage $V_S$ at the common circuit node of shunt resistor $R_S$ and LED device 20. In this example, the voltage $V_S$ equals $V_{IN}-R_S \cdot i_{OUT}$, and the control circuit can determine the load current according to the equation $i_{OUT}=(V_{IN}-V_S)/R_S$. The control circuit 5 may include an analog-to-digital converter to digitize the voltages $V_{IN}$ and $V_S$; in this case the control circuit 5 can regularly digitally calculate the load current value and adjust the set-point in accordance with a given control characteristic. As mentioned, in the present example the set-point information is output as the PWM signal $V_{PWM}$.

In order to make the programming of parameters such as the nominal set-point used for load current regulation easier and more flexible, the control circuit may include a Near Field Communication (NFC) transceiver circuit as well as an NFC antenna 4 connected thereto. At the end of production (or at any time during the production process of the control circuit or the lighting module), the nominal set-point and other parameters can be easily programmed using an NFC coupling device (e.g. an NFC writer) that is operable to transmit the information about the parameters to the NFC transceiver circuit included in the control circuit 5, which then stores the received information, e.g., in a non-volatile memory (NVM) that may be integrated in the control circuit 5. It is understood that the mentioned nominal set-point and other parameters are customer or application specific and chosen for a specific application, e.g. a specific lighting module with a specific LED device.

Figure 3:
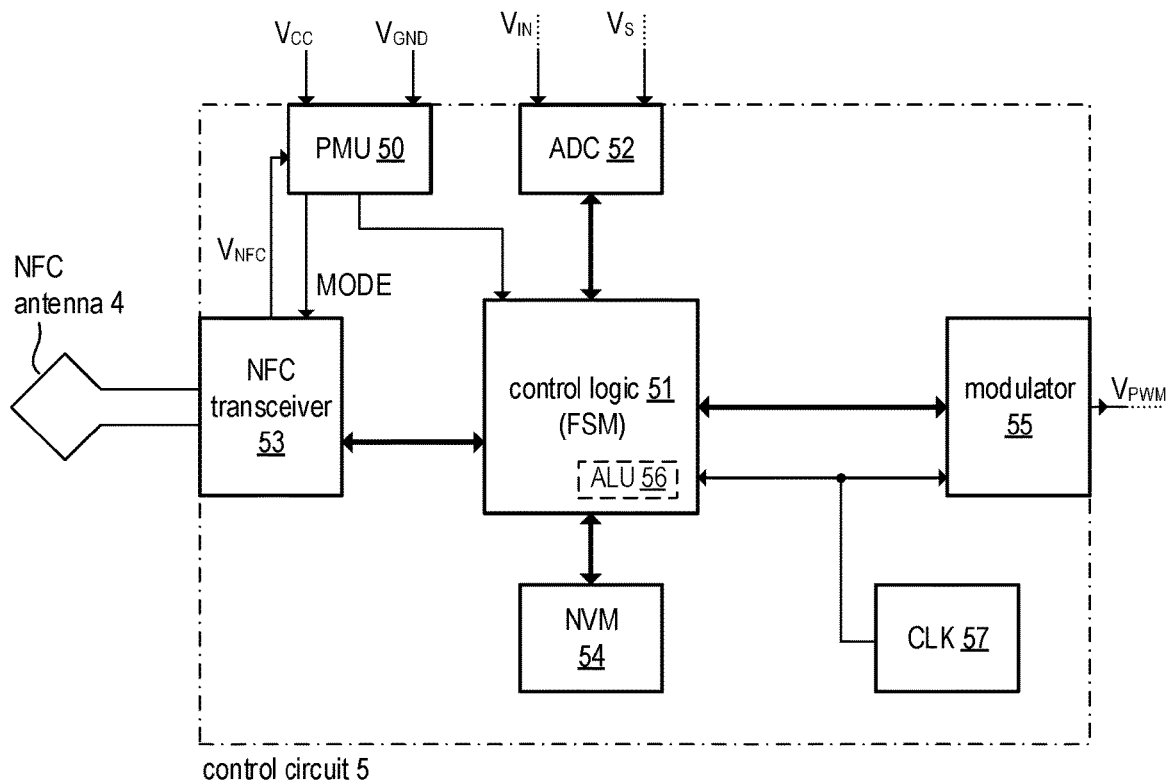
FIG. 3 illustrates one embodiment of the control circuit used in the example of FIG. 2

FIG. 3 illustrates one exemplary embodiment of the control circuit 5 used in the example of FIG. 2. The control circuit 5 may be implemented in one single integrated circuit, e.g. an application specific integrated circuit (ASIC). According to FIG. 3, the control circuit 5 includes a power management unit 50 (PMU), one or more analog-to-digital converters 52, the above-mentioned NFC transceiver 53, as well as a control logic 51, which basically forms a finite state machine (FSM). The control circuit 5 further includes an NVM 54, an arithmetic-logic unit 56 (ALU) and a modulator 55 operable to generate the PWM output signal $V_{PMW}$ (see FIG. 2). An oscillator 57 generates a clock signal for the logic circuit 51, the ALU 56, the modulator 55 and further circuitry that need the clock signal for operation. As illustrated in FIG. 3, the ALU 56 can be regarded as part of the logic circuit 51 which is, however, an implementation detail irrelevant for the function of the overall control circuit 5.

The power management unit 50 receives, at respective supply pins, a first supply voltage $V_{CC}$ (e.g. 5 volts) and a reference potential $V_{GND}$, e.g. ground potential. Alternatively to the supply voltage $V_{CC}$, the PMU may receive a supply voltage $V_{NFC}$ from the NFC transceiver 53 when the NFC transceiver 53 receives energy from an external NFC coupling device (not shown) via NFC antenna 4. However, the NFC transceiver 53 and its functions will be discussed in more detail later. Although not all supply lines are explicitly shown in FIG. 3, the PMU 50 is operable to provide voltage supply to all circuitry included in the control circuit 5.

The analog-to-digital converter (ADC) 52 receives, at respective analog input pins (see FIG. 2, terminals AIN1, AIN2), voltage signals $V_{IN}$ and $V_S$ which carry information about the input voltage $V_{IN}$ and the load current $i_{OUT}$ passing through the LED device 20. Various options for sensing the load current have already been discussed above with reference to FIG. 2 and are thus not repeated here. The ADC may have two channels that are able to simultaneously sample the voltage signals $V_{IN}$ and $V_S$ or a multiplexer may be used to use one ADC channel for sampling both signals $V_{IN}$ and $V_S$ in an alternating manner.

The control logic 51 is operable to control the operation of the control circuit 5 and particularly the signal flow within the control circuit 5. The NVM 54 and the ALU 56 are connected to the control logic 51, which is operable to determine (with the help of the ALU 56) the set-point to be used for current regulation based on the parameters (e.g. the nominal set-point value) stored in the NVM 54 and the sampled values received from the ADC 52. The control logic 51 is further operable to provide the set-point information (e.g. in the form of a digital word) to the modulator 55. The modulator 55 is operable to output, e.g. at a digital output pin DOUT, a PWM signal $V_{OUT}$ which has a duty cycle that represents the set-point information. If, for example, the input voltage $V_{IN}$ increases to such an extent that the total electrical power (input voltage $V_{IN}$ times load current $i_{OUT}$, see FIG. 2) exceeds a specific maximum value, then the control logic 51 will reduce the set-point accordingly and, consequently, the PWM signal output to the LED driver circuit 10 will indicate a lower set-point and the current regulator included in the LED driver circuit 10 will reduce the load current. As already mentioned above, the modulator 55 is not necessarily operable to perform pulse-width modulation (PWM), and other types of modulation such as, for example, sigma-delta modulation (pulse density modulation) are also applicable.

As mentioned, parameters such as a nominal current set-point can be received by the NFC transceiver 53 from an external NFC coupling device (not shown in the figures) and stored in the NVM 54. In one embodiment the control circuit 5, and particularly the control logic 51 included therein, is operable to operate in two different modes. The first mode, which may be referred to as programming mode, is characterized in that the control circuit 5 is not supplied with the supply voltage $V_{CC}$ at the respective supply pin but rather receives electrical power from an active NFC field generated by an external NFC device. In this first mode, the NFC transceiver will generate a supply voltage $V_{NFC}$ which can be distributed to the control logic 51 and the NVM 54 (e.g. via the PMU 50) in order to allow storing the parameters received from the NFC coupling device via the NFC communication channel in the NVM 54. The second mode, which may be referred to as normal mode of operation, is characterized in that the control circuit 5 is supplied with the supply voltage $V_{CC}$ at the respective supply pin. In the second mode, the NFC transceiver is disabled, e.g. by receiving a respective mode signal (disable signal) from the PMU 50 in response to the PMU 50 detecting the presence of the supply voltage VCC at the supply pin. Alternatively, the disable signal may be generated by the control logic 51 or other circuitry included in the control circuit 5. The NFC transceiver 53 being disabled means that the NFC transceiver 53 can neither generate an NFC field nor transmit any RF signals via the antenna 4.

Disabling the NFC transceiver 53 may be achieved in various ways. For example, an electronic switch may be used to prevent the NFC transceiver 53 from generating the supply voltage $V_{NFC}$ from an externally generated (e.g. by an NFC coupling device) NFC field. The electronic switch (e.g. a depletion MOS transistor), may for example disconnect or short circuit a capacitor, which is used to buffer the voltage $V_{NFC}$ when the supply voltage $V_{CC}$ is present at the respective supply pin. Alternatively, an electronic switch may be used, for example, to disconnect the NFC antenna 4 or otherwise disable the NFC antenna 4 (e.g. by short-circuiting the two antenna terminals using an electronic switch).

In one specific embodiment, the NFC transceiver 53 may be permanently deactivated once a parameter set has been successfully received via the NFC communication channel and stored in the NVM 54. This permanent deactivation may be achieved in various ways. For example, the NFC transceiver may include an electrically programmable fuse bit which is set once a parameter set has been successfully received and stored. Based on the state of the fuse bit, the NFC transceiver 53 may be deactivated in a similar manner as described above.

Ensuring that the NFC transceiver is inactive during the normal mode of operation, i.e. when the control circuit 5 is supplied with the supply voltage $V_{CC}$, has the advantage that the chip including the control circuit 5 will not be regarded as an RF device in various legislations. As a consequence, certification of the RF device will not be required in these legislations. Furthermore, it can be ensured that the RF circuits included in the NFC transceivers will not cause any electromagnetic interferences (EMI) and related disturbances in other electronic components or devices.

It should be noted that the control logic 51 as well as the ALU 56 (which may also be regarded as part of the control logic 51) are composed of hard-wired circuit components and do not require software. In other words, the control logic 51 does not include a processor operable to execute software instructions. Furthermore, the control circuit 51, the PMU 50, the ADC 52 as well as the NFC transceiver 53 are integrated in a single chip or a single chip package. Integration in a common chip allows for a comparably simple deactivation of the NFC transceiver 53 when the supply voltage $V_{CC}$ is received at the respective supply pin normal mode of operation).

Figure 4:
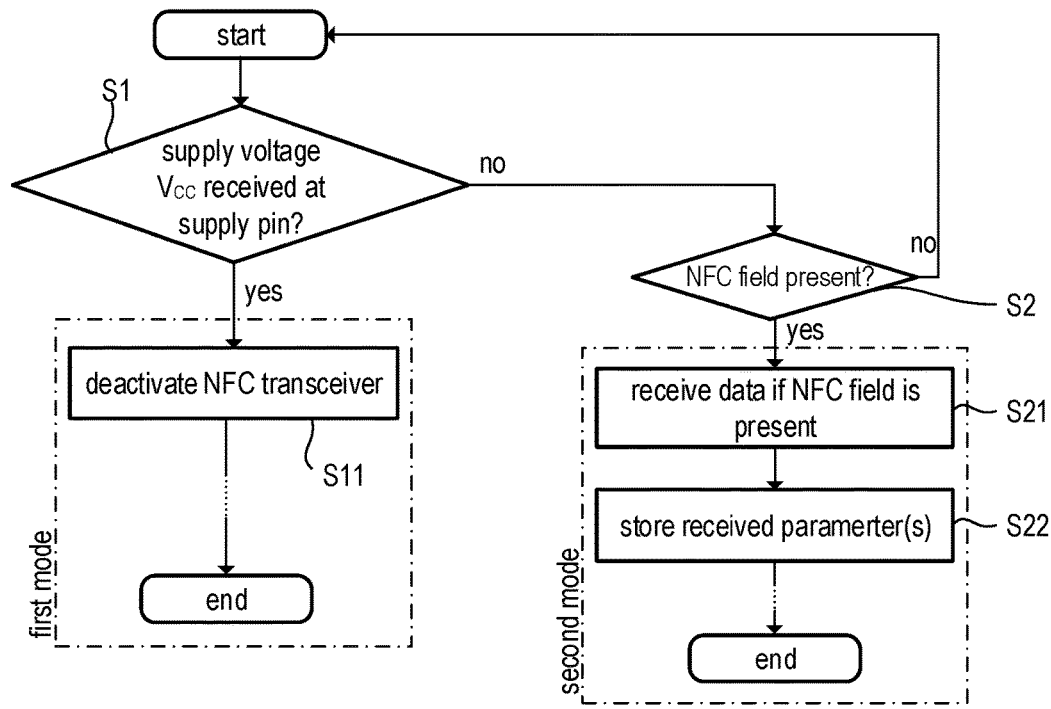
FIG. 4 is a flow chart illustrating a method for operating a control circuit in accordance with one embodiment.

FIG. 4 is a flow chart illustrating a method in accordance with one embodiment. The method may be essentially (but not exclusively) performed by the control logic 51 of the control circuit 5 described above. According to FIG. 4 the circuit is able to operate in a first mode or a second mode. The circuit operates in the first mode, when a supply voltage $V_{CC}$ is received at the supply pin (FIG. 4, step S1, yes-branch). The circuit operates in the second mode, when no supply voltage $V_{CC}$ is received at the supply pin (FIG. 4, step S1, no-branch) and when an NFC field is present so that the NFC transceiver is able to generate an alternative supply voltage $V_{NFC}$ from the NFC field (FIG. 4, step S2, yes-branch). If neither a supply voltage $V_{CC}$ is received nor an NFC field is present, then the circuit is passive and does not operate. In the first mode of operation, it is ensured that the NFC transceiver is deactivated (FIG. 4, step S11). Further functions provided in the first mode (e.g. generating modulated signal $V_{PWM}$, etc.) have been discussed above and not repeated here. In the second mode of operation, the NFC field is the only source of energy of the circuit, and the NFC transceiver generates the alternative supply voltage $V_{NFC}$ for supplying other circuitry such as the control logic 51 and the NVM 54 (cf. FIG. 3), so that data can be received via the NFC communication channel (FIG. 4, step S21) and the received data (i.e. the one or more parameters discussed above, e.g. a nominal current set-point to be used for current regulation) can be stored in the NVM 54 (FIG. 4, step S22). In one specific embodiment, which makes use of the fuse bit circuit mentioned above, operation in the second mode can only start when the fuse bit state indicates that the NVM 54 has not yet been programmed Once the fuse bit has been fused (set) the NFC transceiver 53 is prevented from generating the alternative supply voltage $V_{NFC}$ from an external NFC field, and thus the circuit does not power up.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A circuit comprising:
a supply pin operable to receive a supply voltage;
a non-volatile memory for storing one or more parameters;
a Near Field Communication (NFC) transceiver operative to receive data from a wireless signal and store the received data in the non-volatile memory;
wherein the circuit is operative to deactivate the NFC transceiver in response to receiving the supply voltage at the supply pin; and
wherein the data stored in the non-volatile memory indicates a current setpoint of controlling current through a load.

2. The circuit of claim 1 further comprising:
a modulator operable to generate a modulated output signal, which depends on at least one of the one or more parameters stored in the non-volatile memory.

3. The circuit of claim 1 further comprising:
control logic operable to operate:
in a first mode during first conditions in which the supply voltage is received at the supply pin, and
in a second mode during second conditions in which no supply voltage is received at the supply pin and a further supply voltage is generated by the NFC transceiver.

4. The circuit of claim 3, wherein the NFC transceiver is coupled to an NFC antenna and is operable to generate the supply voltage from an active NFC field received by the NFC antenna.

5. The circuit of claim 3 further comprising:
a fuse bit circuit;
wherein the circuit is operable to deactivate the NFC transceiver in response to a state of the fuse bit circuit; and
the state of the fuse bit circuit being indicative of whether or not the one or more parameters have been previously stored in the non-volatile memory while operating in the second mode.

6. The circuit of claim 1 further comprising:
a power management unit coupled to the supply pin, the power management unit operable to detect conditions in which the supply voltage is received at the supply pin.

7. The circuit of claim 6, wherein the power management unit is further operable to generate a mode signal that causes the NFC transceiver to be deactivated when the power management unit detects that the supply voltage is received at the supply pin.

8. The circuit of claim 1 further comprising:
a modulator operable to generate a modulated output signal, a setting of the modulated output signal depending on the data stored in the non-volatile memory and a first received signal and a second received signal.

9. The circuit of claim 1 further comprising:
control logic operable to: i) determine an amount of current delivered to a load, and ii) produce a modulated output signal having a duty cycle depending at least in part on the data stored in the non-volatile memory and the determined amount of delivered current.

10. The circuit of claim 1 further comprising:
a fuse; and
wherein the circuit is operable to deactivate the NFC transceiver in response to a state of the fuse, the state of the fuse being indicative that the data having been previously stored in the non-volatile memory.

11. The circuit of claim 1, wherein the Near Field Communication transceiver includes a Near Field Communication antenna operative to receive near field communication signals; and
wherein deactivation of the Near Field Communication transceiver includes short-circuiting the Near Field Communication antenna.

12. The circuit of claim 1, wherein the Near Field Communication transceiver includes an electronic switch operative to prevent the Near Field Communication transceiver from generating a voltage from a received near field communication signal.

13. The circuit of claim 1, wherein deactivation of the Near Field Communication transceiver prevents the Near Field Communication transceiver from causing electromagnetic interference with other electronic devices.

14. A circuit comprising:
a supply pin operable to receive a supply voltage;
a non-volatile memory;
a Near Field Communication (NFC) transceiver operative to receive data; and
wherein the circuit is operative to deactivate the NFC transceiver in response to receiving the supply voltage at the supply pin, the circuit further comprising:
an analog-to-digital converter operable to receive and digitize a first signal and a second signal.

15. The circuit of claim 14 further comprising:
a modulator operable to generate a modulated output signal, which depends on at least one of the one or more parameters stored in the non-volatile memory as well as on the first signal and the second signal.

16. The circuit of claim 14, wherein the first signal is indicative of a voltage provided to a load and the second signal is indicative of a load current passing through the load;
wherein control logic is operable to determine a value indicative of electric power from the digitized first signal and the digitized second signal; and
wherein, in a first mode, a modulated output signal has a duty cycle depending on at least one of the one or more parameters stored in the non-volatile memory and the determined value indicative of the electric power.

17. The circuit of claim 14, wherein the first signal and second signal represent a differential voltage.

18. The circuit as in claim 17, wherein a magnitude of the differential voltage is proportional to a magnitude of current through a light source.

19. A system including:
a lighting device including at least one light emitting diode;
a driver circuit connected to the lighting device and operable to provide a load current to the lighting device, the lighting device being regulated in accordance with a set-point value, which is determined by a set signal received at an input pin of the driver circuit;
the circuit according to claim 2, wherein the modulated output signal is indicative of the set-point value and wherein the set signal is determined by the modulated output signal.

20. The system of claim 19 further comprising:
a low-pass filter coupled between the circuit and the driver circuit, the low pass filter operable to receive the modulated output signal and to generate the set signal.

21. A method of operating a circuit, the circuit comprising a supply pin, a non-volatile memory, and a Near Field Communication (NFC) transceiver, the method comprising:
in a first mode of operation, in which no supply voltage is received at the supply pin: receiving, by the NFC transceiver, data representing one or more parameters and storing the one or more parameters in the non-volatile memory; and
in a second mode of operation, in which the supply voltage is received at the supply pin: deactivating the NFC transceiver, the method further comprising:
determining an amount of output current delivered to a load; and
producing a modulated output signal having a duty cycle depending at least in part on the data stored in the non-volatile memory and the determined amount of delivered output current.

22. The method of claim 21, wherein the load is an LED device; and
wherein the modulated output signal represents a current set-point used by a current regulator of a LED (Light Emitting Diode) driver, which provides the output current to the LED device, the output current being regulated.

23. The method of claim 21, wherein the data stored in non-volatile memory indicates a current setpoint of controlling current through a load.

24. A circuit comprising:
a supply pin operable to receive a supply voltage;
a non-volatile memory for storing one or more parameters;
a Near Field Communication (NFC) transceiver operative to receive data from a wireless signal and store the received data in the non-volatile memory;
wherein the circuit is operative to deactivate the NFC transceiver in response to receiving the supply voltage at the supply pin; and
wherein deactivation of the Near Field Communication transceiver is permanent deactivation of the Near Field Communication transceiver.

25. The circuit of claim 24, wherein the permanent deactivation of the near field communication transceiver is implemented after the data is stored in the non-volatile memory.

26. The circuit of claim 25, wherein the data stored in the non-volatile memory is wirelessly received via an antenna of the Near Field Communication transceiver.

27. A circuit comprising:
a supply pin operable to receive a supply voltage;
a non-volatile memory for storing one or more parameters;
a Near Field Communication (NFC) transceiver operative to receive data from a wireless signal and store the received data in the non-volatile memory;
control logic operable to: i) monitor an amount of current delivered to a load, ii) compare the monitored amount of current to a setpoint value, and iii) adjust the amount of current to the load with respect to the setpoint value; and
wherein the circuit is operative to deactivate the NFC transceiver in response to receiving the supply voltage at the supply pin.

28. The circuit of claim 27, wherein the control logic is operative to produce a pulse width modulated control signal to control a magnitude of the current delivered to the load.

29. The circuit of claim 28, wherein the load is a light source.

* * * * *